United States Patent
Fischer et al.

(10) Patent No.: US 10,414,087 B2
(45) Date of Patent: Sep. 17, 2019

(54) STRUCTURE STAMP, DEVICE AND METHOD OF EMBOSSING

(71) Applicant: EV GROUP E. THALLNER GMBH, St. Florian am Inn (AT)

(72) Inventors: Peter Fischer, Taufkirchen an der Pram (AT); Gerald Kreindl, Scharding (AT); Jakob Harming, Bjerringbro (DK); Christine Thanner, Dietersburg (DE); Christian Schon, Andorf (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 0 days.

(21) Appl. No.: 15/979,604

(22) Filed: May 15, 2018

(65) Prior Publication Data
US 2018/0257295 A1    Sep. 13, 2018

Related U.S. Application Data

(62) Division of application No. 14/425,657, filed as application No. PCT/EP2012/067430 on Sep. 6, 2012, now Pat. No. 10,005,225.

(51) Int. Cl.
*B29C 59/00* (2006.01)
*B29C 59/02* (2006.01)
(Continued)

(52) U.S. Cl.
CPC .......... *B29C 59/022* (2013.01); *B29C 59/002* (2013.01); *B82Y 10/00* (2013.01);
(Continued)

(58) Field of Classification Search
CPC ....... B29C 33/424; B82Y 10/00; B82Y 40/00; G03F 7/0002; G03F 7/0017
See application file for complete search history.

(56) References Cited

U.S. PATENT DOCUMENTS 6,792,856 B2   9/2004   Hall et al.
7,288,013 B2   10/2007  Yokoyama et al.
(Continued)

FOREIGN PATENT DOCUMENTS

CN   1875448 A    12/2006
CN   201260141 Y   6/2009
(Continued)

OTHER PUBLICATIONS

International Search Report from corresponding International Patent Application No. PCT/EP2012/067430, dated Jan. 8, 2013 (English-language translation provided).
(Continued)

*Primary Examiner* — Joseph S Del Sole
*Assistant Examiner* — Thu Khanh T Nguyen
(74) *Attorney, Agent, or Firm* — Kusner & Jaffe

(57) ABSTRACT

A structure stamp has a flexible stamp which has a microstructured or nanostructured stamp surface for embossing of an embossing structure which corresponds to the stamp surface on an embossing surface, and a frame for clamping the stamp. Moreover, the invention relates to a device for embossing an embossing pattern on an embossing surface with the following features: a stamp receiver for accommodating and moving a structure stamp, an embossing material receiver for accommodating and placing an embossing material opposite the structure stamp, and an embossing element drive for moving an embossing element along the structure stamp.

6 Claims, 2 Drawing Sheets

(51) Int. Cl.
    *G03F 7/00*         (2006.01)
    *B82Y 10/00*      (2011.01)
    *B82Y 40/00*      (2011.01)

(52) U.S. Cl.
    CPC ............ *B82Y 40/00* (2013.01); *G03F 7/0002* (2013.01); *G03F 7/0017* (2013.01); *B29C 2059/023* (2013.01); *B29K 2821/003* (2013.01)

(56) References Cited

U.S. PATENT DOCUMENTS

| | | | |
|---|---|---|---|
| 8,163,222 B2 * | 4/2012 | Done | B29C 59/022 |
| | | | 264/293 |
| 8,166,876 B2 | 5/2012 | Schneider et al. | |
| 9,452,563 B2 | 9/2016 | Itani et al. | |
| 9,649,787 B2 | 5/2017 | Itani et al. | |
| 2004/0197712 A1 | 10/2004 | Jacobson et al. | |
| 2005/0212182 A1 | 9/2005 | Yokoyama et al. | |
| 2006/0231979 A1 | 10/2006 | Santen et al. | |
| 2007/0176314 A1 | 8/2007 | Jung et al. | |
| 2008/0028958 A1 | 2/2008 | Park et al. | |
| 2008/0093979 A1 | 4/2008 | Bechtel et al. | |
| 2008/0160129 A1 * | 7/2008 | Resnick | G03F 7/0002 |
| | | | 425/385 |
| 2008/0202365 A1 | 8/2008 | Schneider et al. | |
| 2008/0271628 A1 | 11/2008 | Kruijt-Stegeman et al. | |
| 2009/0061116 A1 | 3/2009 | Yokoyama | |
| 2011/0039040 A9 | 2/2011 | Yokoyama et al. | |
| 2012/0061875 A1 | 3/2012 | Kono | |
| 2012/0193832 A1 | 8/2012 | Torii | |
| 2012/0313289 A1 | 12/2012 | Itani et al. | |
| 2012/0326346 A1 | 12/2012 | Itani et al. | |
| 2013/0122135 A1 | 5/2013 | Petrzelka | |
| 2015/0129138 A1 | 5/2015 | Turner et al. | |

FOREIGN PATENT DOCUMENTS

| | | |
|---|---|---|
| EP | 2 546 048 A1 | 1/2013 |
| JP | H03-203645 A | 9/1991 |
| JP | H09-91776 A | 4/1997 |
| JP | 2008-508707 A | 3/2008 |
| JP | 2008-540164 A | 11/2008 |
| JP | 2009-206519 A | 9/2009 |
| JP | 2011-035346 A | 2/2011 |
| JP | 2011-177956 A | 9/2011 |
| JP | 2011-183641 A | 9/2011 |
| JP | 4889133 B1 | 12/2011 |
| JP | 2012-060141 A | 3/2012 |
| KR | 2006-0096069 A | 9/2006 |
| WO | WO-2003/065120 A2 | 8/2003 |
| WO | WO-2006/117745 A2 | 11/2006 |
| WO | WO-2006/135170 A1 | 12/2006 |

OTHER PUBLICATIONS

Office Action issued in corresponding Japanese Patent Application No. 2015-530303 dated Mar. 16, 2016.
Office Action issued in corresponding Korean Patent Application No. 10-2014-7034112.
Office Action issued in related U.S. Appl. No. 14/425,657 dated Nov. 15, 2017.

* cited by examiner

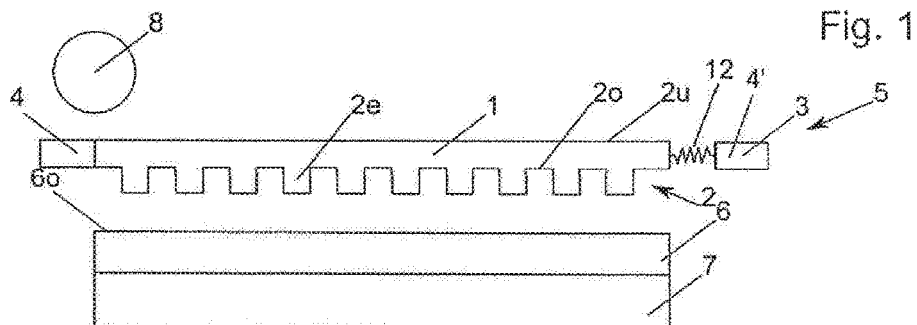
Fig. 1
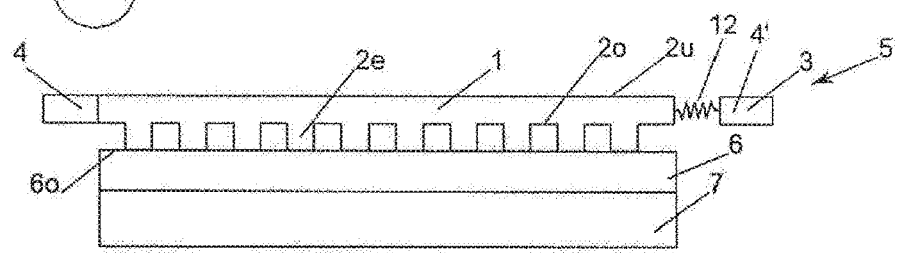
Fig. 2
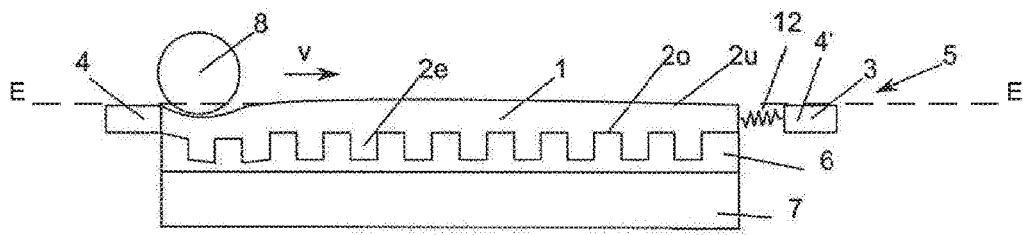
Fig. 3
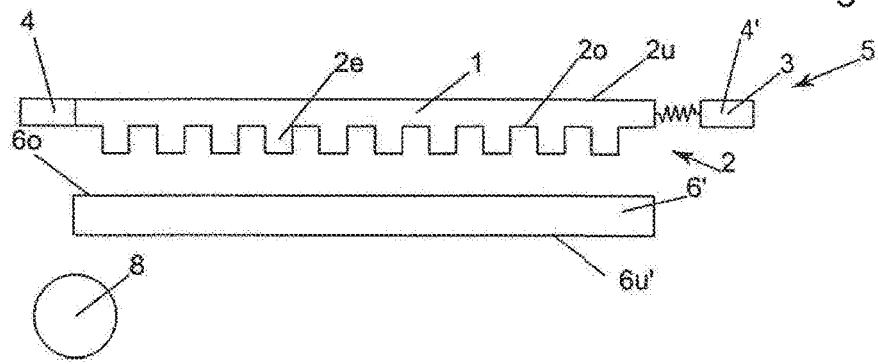
Fig. 4
Fig. 5

STRUCTURE STAMP, DEVICE AND METHOD OF EMBOSSING

RELATED APPLICATIONS

This application is a divisional of U.S. application Ser. No. 14/425,657, filed Apr. 23, 2015, currently granted, which is a U.S. National Stage of International Application No. PCDEP2012/067430, filed Sep. 6, 2012, said patent application hereby fully incorporated herein by reference.

FIELD OF THE INVENTION

This invention relates to a structure stamp for embossing, a device for embossing an embossing pattern and a method for embossing an embossing pattern.

BACKGROUND OF THE INVENTION

The state of the art for microstructuring and/or nanostructuring of surfaces comprises mainly photolithography and various embossing techniques. The embossing techniques work either with hard or soft stamps. Recently, embossing lithography techniques have prevailed and are displacing classical photolithography techniques. Among embossing lithography techniques, the use of so-called soft stamps is becoming more and more favored. The reason is the easy manufacture of the stamps, efficient embossing processes, very good surface properties of the respective stamp materials, low costs, the reproducibility of the embossing product and the possibility of elastic deformation of the stamp during mold removal. In soft lithography, a stamp of an elastomer with a microstructured or nanostructured surface is used to produce structures in the range from 20 nm to >1000 μm.

There are six known techniques:
- microcontact and/or nanocontact printing (μ/nCP)
- replica molding (REM)
- microtransfermolding (μTM) or nanoimprint lithography (NIL),
- micromolding in capillaries (MIMIC)
- solvent-assisted micromolding (SAMIM) and
- phase shift lithography.

Elastomer stamps are produced as a negative of a master. A master stamp is a hard stamp of metal or ceramic which is produced one time by correspondingly complex processes. Then any number of elastomer stamps can be produced from the master. The elastomer stamps enable conforming, uniform contact over large surfaces. They can be easily separated from their master stamp, and from the embossing products. Furthermore, elastomer stamps have low surface tension for easy and simple separation from the stamp and substrate. For automated implementation of soft lithography processes, it is necessary to support the elastomer stamp by a carrier. Currently, glass carrier substrates with different thicknesses are used. By using thick glass substrates, the elastomer stamp, however, at least partially loses its flexibility.

The use of rigid carriers makes automatic separation of the stamp and substrate after the embossing process difficult, as a result of which process automation and industrial usability of imprint lithography are only possible with difficulty.

An advantage of the present invention is a device and a method for microstructuring and/or nanostructuring with which automation and a faster process sequence can be ensured.

This advantage is achieved with the claimed features. Advantageous developments of the invention are given in the dependent claims. All combinations of at least two of the features given in the specification, the claims and/or the figures also fall within the scope of the invention. At the given value ranges, values within the indicated limits will also be considered to be disclosed as boundary values and will be claimed in any combination.

SUMMARY OF THE INVENTION

The invention describes a method and a device in which a structure stamp is used which is comprised of a microstructured and/or nanostructured, at least partially, preferably largely elastomer stamp, a film stamp, and a frame. The stamp is exposed to a line force which extends transversely to the length on one exposure side along its entire length, in a continuous process, in order to press the structures into the embossing material. Advantageously, exposure takes place using an embossing element, e.g., a rigid embossing roll.

Hereinafter, a stamp is defined as any type of component which has corresponding structure elements on its surface and which has the flexibility in the embossing process. A stamp can be an individual component or a compound component. If the stamp is made only as an individual component, the stamp is comprised of a film or a flexible plate in which the corresponding structure elements have been produced. In the case of a compound stamp, the stamp is comprised of a carrier and a corresponding stamp component which has structure elements. In this respect, the carrier and/or stamp component, as a component group, must have the necessary flexibility to be able to be deformed accordingly by the embossing element.

According to this invention, a line force means that a force is applied at least largely, completely in a first direction, transversely to the movement of the embossing element along the stamp (therefore encompasses, for example, the entire effective width of the stamp), while in a second direction (transversely to the first direction) only a comparatively very small area (in a ratio of 1 to 5, preferably 1 to 10, even more preferably 1 to 20, still more preferably 1 to 100 to the first direction) is exposed at the same time. This yields a comparatively small exposure area relative to the total area of the stamp which is being exposed at the same time. In this way, not only is a very defined exposure enabled, but also very homogeneous embossing is achieved. Moreover, the invention allows a large-area application of the embossing process, with a width greater than 0.5 m, preferably greater than 1 m, more preferably greater than 2 m and/or a length greater than 0.5 m, preferably greater than 1 m, more preferably greater than 2 m.

The arrangement of the stamp in a modular frame enables automation of the method and thus a faster process sequence.

The structure stamp is developed by the stamp being clamped by means of two clamping strips which are located on the two opposing clamping sides. The clamping strips encompass fixing means for fixing of the stamp on the structure stamp.

Each clamping strip can be fixed on the frame either directly or via a spring system. In any case, preferably at least one of the clamping strips is attached to the frame by means of springs. In special embodiments, still other clamping strips on the longitudinal sides can be used to fix and/or clamp the stamp transversely to the longitudinal direction.

Clamping strips which run transversely to the longitudinal direction are used for reducing, i.e., avoiding (uncontrolled) transverse contraction.

As claimed in the invention, the structure stamp can be part of an expanded assembly which has guide strips in which the embossing element can be moved linearly. In the assembly, either adjusting screws (manual alignment) or motors (automatic alignment) are installed to ensure also angular alignment of the stamp. According to one advantageous embodiment of the invention, two guide strips which run opposite, i.e., parallel to one another, are provided for guiding an embossing element, e.g., an embossing roll, along one exposure side of the stamp, which side is located along one side of the stamp facing away from the stamp surface. The guide strips are used to guide the embossing element in a component which can also accommodate the structure stamp. Thus, the movement of the embossing element is assigned directly to the frame which fixes the stamp, more or less decoupled from the device which drives the embossing element for accommodating the structure stamp and for control of the structure stamp with a control apparatus. In the corresponding embodiments in which longitudinal clamping of the stamp takes place by at least one clamping strip on one of the two longitudinal sides, preferably on both clamping sides, the clamping sides of the longitudinal side would be functionally identical to the guide strips.

To the extent the structure stamp is made flexible such that the stamp can expand beyond the surface plane which is defined by the frame, by the guide strips, by means of an embossing element, the alignment of the structure stamp relative to the embossing surface which is to be embossed is facilitated and can be more easily automated.

In a development of this invention, it is provided that the stamp is formed from a carrier and an elastomer stamp which is hot-embossed or molded onto it. In this way, the production of the structure stamp becomes more favorable.

By the structure stamp comprising a retaining frame which accommodates the frame on its side facing away from the stamp surface, the automation, the changing of the structure stamp, is further simplified, since an interface between the device and the structure stamp or the frame of the structure stamp is made available. The aforementioned retaining frame, in conjunction with an embossing element which is guided along the frame, can be regarded as an independent invention.

In a development of the invention and/or of the retaining frame, it is conceivable to guide the embossing element between the retaining frame and the frame, parallel to the opposite clamping sides such that the embossing element can be guided along the stamp film and/or the latter is made to expose to an embossing force.

Moreover, a device for embossing of an embossing pattern on an embossing surface with the following features is disclosed as an independent invention:
- a stamp receiver for accommodating and moving a stamp, especially according to one stamp described above,
- an embossing material receiver for accommodating and placing an embossing material opposite the stamp,
- an embossing element drive for moving an embossing element which is made according to one as described here, along the stamp.

According to the device, a control apparatus is disclosed for controlling the described method and for executing the described movement of the components of the device and/or of the structure stamp, of the retaining frame, the frame or the embossing element, individually or jointly. Corresponding drives and guide elements for executing the movements are likewise assigned to the device in this way. The drives allow the translational movement of the retaining frame in the x- and/or y- and/or z-direction, which movement is controlled by the control apparatus. Preferably, rotation around the x- and/or y- and/or z-axis is also possible. The drives advantageously allow prepositioning of the retaining frame and thus of the structure stamp and of the stamp relative to the embossing mass.

Moreover, a method for embossing an embossing pattern on an embossing surface of an embossing material with the following steps, the following sequence, is disclosed as an independent invention:
- placing the surface of the stamp of a structure stamp opposite the embossing material,
- moving an embossing element along the structure stamp over the stamp and in doing so embossing the embossing material by applying the stamp surface to the embossing material.

Here, it is advantageous if the stamp is made flexible and during embossing by the embossing element is expanded beyond a surface plane which is defined by the frame, for example, by guide strips. The flexibility is increased by possible springs between the frame and clamping strips. Although the preferred embodiment is the one with a spring system, when the stamp is flexible enough the spring system can be omitted.

Furthermore, it is advantageous to accommodate the frame on its side facing away from the stamp surface by a retaining frame.

According to one advantageous embodiment of the method, the embossing element is guided between the retaining frame and the frame, parallel to the opposite clamping sides, along the stamp and is exposed to an embossing force.

In correspondingly large versions of the device, the embossing force must be accordingly large. The following exemplary ranges of values for one execution of the invention are disclosed below. The embossing force being applied is in the range of values between 0 N and 1000 N, preferably between 0 N and 100 N, more preferably between 0 N and 50 N, most preferably between 0 N and 10 N.

Hardware features of the device and/or of the structure stamp should also be considered disclosed as method features and vice versa.

Other advantages, features and details of the invention will become apparent from the following description of preferred exemplary embodiments and using the drawings.

BRIEF DESCRIPTION OF THE DRAWINGS

FIG. 1 shows a schematic cross sectional view of a first embodiment of this invention, and a first method step of alignment of a structure stamp relative to an embossing material which has been applied to a substrate, i.e., a first process step, FIG. 2 shows a schematic cross sectional view of a second method step of causing the structure stamp to approach the embossing material to be embossed, i.e., the second method step, FIG. 3 shows a schematic cross sectional view of a third method step of applying the embossing element to the structure stamp (start of embossing), FIG. 4 shows a schematic view of the method step according to FIG. 3 at the end of embossing, FIG. 5 shows a schematic cross sectional view of a second embodiment of the method.

DETAILED DESCRIPTION OF THE PREFERRED EMBODIMENTS

Figure 6:
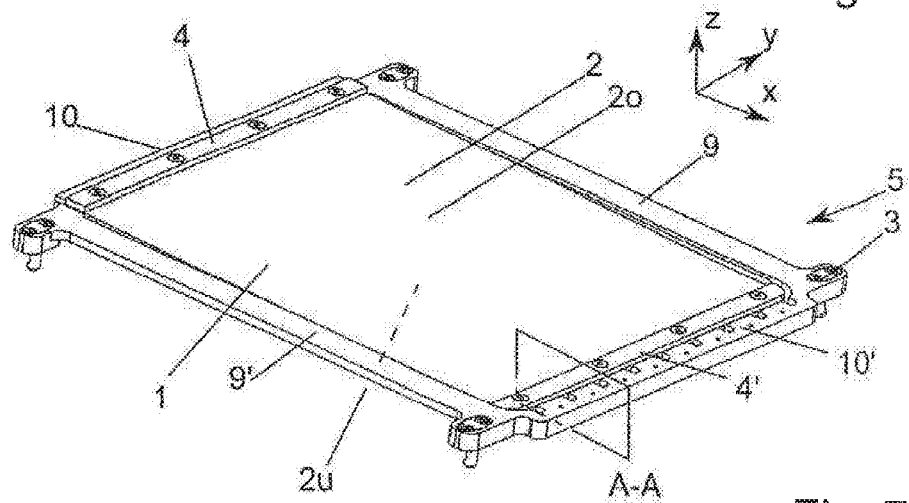
FIG. 6 shows a schematic perspective view of the structure stamp.

In the figures, advantages and features of the invention are labeled with the reference numbers which identify them according to embodiments of the invention, components or features with the same function or function with the same effect being labeled with identical reference numbers.

In the figures, the features in FIGS. 1 to 5 are not shown to scale, in order to be able to represent the operation of the individual features at all. The ratios of the individual components are in part also disproportionate; this can be attributed especially to nanostructures 2e which are shown highly enlarged. The nanostructures 2e, which are embossed with this invention or which are used for embossing of corresponding nanostructures onto workpieces, are in the nanometer and/or micron range, while the magnitude of the size of the machine components is in the centimeter range.

The dimensions of the individual nanostructures 2e of the embossing pattern 2 are preferably in the micron range and/or nanometer range. The dimensions of the individual nanostructures 2e are smaller than 1000 μm, preferably smaller than 10 μm, more preferably smaller than 100 nm, still more preferably smaller than 10 nm, most preferably smaller than 1 nm.

In the first embodiment shown in FIGS. 1 to 4 and 6, a structure stamp 5 is shown which is comprised of a frame 3 and a stamp 1 clamped into the frame 3.

The stamp 1 has a microstructured or nanostructured stamp surface 2 with nanostructures 2e (elevations) which project from the carrier side 2o of the stamp 1.

One exposure side 2u which is opposite the stamp surface 2 is made flat so that exposure of the stamp 1 as homogeneous as possible on the exposure side 2u is enabled.

An embossing element 8 is used for exposure, here in the form of an embossing roll which is lowered onto the exposure side 2u after alignment of the structure stamp 5 relative to an embossing material 6 which has been applied to a substrate 7 (see FIG. 1) and subsequently causing the structure stamp 5 to approach an embossing surface 6o of the embossing material 6.

The frame 3 on two opposing clamping sides 10, 10' has at least one pair of opposing clamping strips 4, 4' into which the stamp 1 is clamped. The clamping strips 4, 4' can be attached to the frame 3 rigidly or via a spring system 13 (see FIGS. 6 and 7). The use of a spring system 13 as a coupling between at least one of the clamping strips 4, 4' and the frame 3 is used to increase the flexibility of the stamp 1 when stressed by the embossing element 8.

A spring system 13 is comprised of at least two, preferably of more than five, more preferably of more than ten, most preferably of more than 20 springs 12.

The two clamping sides 10, 10' are connected by two guide strips 9, 9' which run oppositely, parallel to one another, the guide strips 9, 9' not coming into contact with the stamp film 1. The stamp film 1 runs preferably within and between the guide strips 9, 9'.

The exposure side 2u is exposed to the embossing element 8 simultaneously with making contact or immersing the nanostructures 2e into the embossing material 6 (see FIG. 3), the structure stamp 5 approaching the embossing element 6 according to FIG. 2 parallel (optionally with minimum angling (wedge faults) of the stamp 1 or structure stamp 5). The nanostructures 2e dip (i.e., is embedded) into the embossing material 6 which is comprised of a low viscosity material and while the structure stamp 5 is approaching the embossing material 6, an embossing force is transferred to the exposure side 2u by the embossing element 8, as the stamp 1 is made parallel to the embossing material 6. In doing so, the stamp 1 deforms in the direction of the embossing material beyond a surface plane E which is defined by the frame 3, i.e., by the guide strips 9, 9'.

A slightly angled approach of the structure stamp 5 to the surface of the embossing material 6 first on one of the two clamping sides 4, 4' is also conceivable so that the nanostructures 2e are gradually immersed.

The embossing element 8 as the stamp 1 approaches (and optionally as the stamp 1 is made parallel) the embossing material 6, especially caused primarily by the embossing force of the embossing element 8, is moved from the first clamping side 4 to the second clamping side 4' located opposite, parallel to the surface of the embossing material 6.

After reaching the position as shown in FIG. 4, the stamp surface 2 is immersed completely in the embossing material 6 and imaged accordingly there.

Then, the embossing material 6 is cured, and after curing of the embossing material 6, the structure stamp 5 can be raised. The curing can take place by all known methods from the front or back, for example, by UV radiation, by chemicals or by heat, and by a combination of the indicated methods.

Alternatively, as described above, during embossing at a defined separation distance and illumination from the opposite side, with corresponding embossing element force (and optionally tension spring adjustment) it can lead to direct separation after contact with the embossing element and illumination.

The use of an embossing roll as the embossing element 8 entails the advantage of a rolling motion and pressure application with the embossing force; this leads to minimization of shearing forces on the stamp 1. Furthermore, complicated wedge fault compensation can be largely omitted which would be essential if the stamp process were to be carried out by a normal movement of the stamp and of the embossing material to one another.

According to the other embodiment, which is shown in FIG. 5, the application of pressure with the embossing element 8 takes place from the opposite side, therefore from the back 6u of the embossing material 6', a corresponding opposing force also acting here, by holding of the frame 3. The embossing material 6' in this case would be suited for pressure transfer itself or optionally supported by a substrate 7, as is shown in the embodiment according to FIGS. 1 to 4. The illustrated embossing material 6' can be, for example, a stable but embossable film.

The embossing element 8 can also be made such that contactless power transfer takes place especially by a gas flow from a line-shaped nozzle or several point nozzles located along a line.

Figure 7:
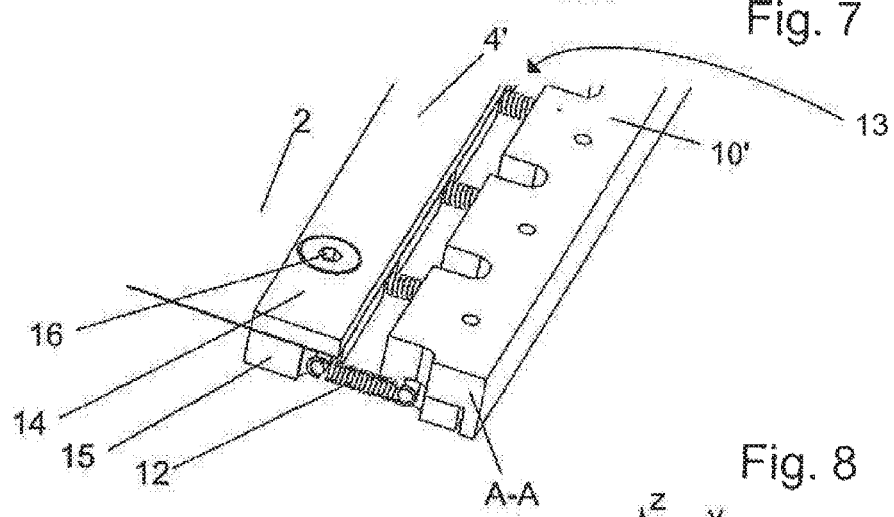
FIG. 7 shows a schematic, enlarged perspective view of a cross sectional element A-A of the structure stamp
Figure 8:
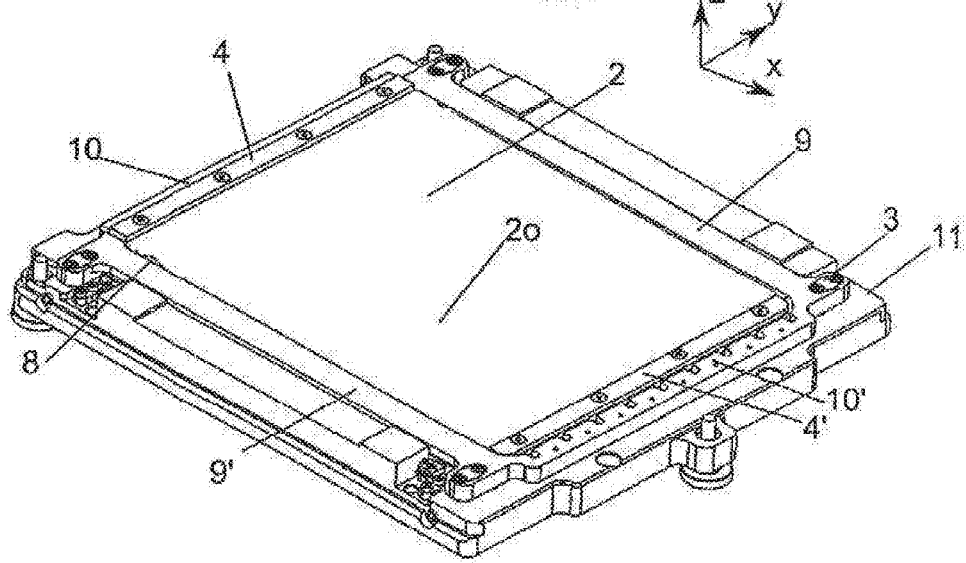
FIG. 8 shows a schematic perspective view of the structure stamp in a retaining frame, with installed embossing element and guide strips.

FIG. 7 shows that the fixing of the stamp 1 on the clamping strips 4, 4' takes place by clamping the stamp 1 between two flat profiles 14, 15. The clamping force necessary for clamping is produced by fixing means 16 (here: screws).

REFERENCE NUMBER LIST 1 stamp
2 stamp surface 2e nanostructures
2o embossing side
2u exposure side
3 frame
4, 4' clamping strips
5 structure stamp
6, 6' embossing material
6o embossing surface
6u back
7 substrate
8 embossing element
9, 9' guide strips
10, 10' clamping sides
11 retaining frame
12 spring
13 spring system
14 flat profile
15 flat profile
16 fixing means
E surface plane Having described the invention, the following is claimed:

1. A method for embossing an embossing pattern on an embossing surface of an embossing material, the method comprising:

placing a microstructured or nanostructured stamp surface of a flexible stamp of a structure stamp opposite the embossing material, the flexible stamp having a microstructured or nanostructured stamp surface, the structure stamp comprising a frame configured to clamp the flexible stamp; and moving an embossing element along the structure stamp, the moving comprising embossing the embossing pattern on the embossing surface of the embossing material by applying the stamp surface to the embossing material, wherein the embossing pattern corresponds to the stamp surface.

2. The method as claimed in claim 1, wherein the moving of the embossing element further comprises expanding the flexible stamp beyond a surface plane E defined by the frame during the embossing.

3. The method as claimed in claim 1, wherein the frame has two guide strips that run opposite to one another; and wherein a surface plane E is defined by the guide strips.

4. The method as claimed in claim 1, wherein a side of the frame that faces away, from the stamp surface is accommodated by a retaining frame.

5. The method as claimed in claim 4, wherein moving the embossing element further comprises:

guiding the embossing element between the retaining frame and the frame along the flexible stamp; and applying an embossing force via the flexible stamp.

6. The method as claimed in claim 1, wherein moving the embossing element further comprises:

guiding the embossing element along the flexible stamp parallel to two opposite clamping sides of the frame that clamp the flexible stamp; and applying an embossing force via the flexible stamp.

* * * * *